(12) United States Patent
Lee (10) Patent No.: US 8,837,254 B2
(45) Date of Patent: Sep. 16, 2014

(54) DATA OUTPUT CONTROL CIRCUIT OF SEMICONDUCTOR APPARATUS

(75) Inventor: Dong Uk Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 334 days.

(21) Appl. No.: 13/217,412

(22) Filed: Aug. 25, 2011

(65) Prior Publication Data

US 2012/0119806 A1 May 17, 2012

(30) Foreign Application Priority Data

Nov. 16, 2010 (KR) ........................ 10-2010-0113766

(51) Int. Cl.
*G11C 8/00* (2006.01)
*G11C 7/00* (2006.01)
*G11C 7/10* (2006.01)
*G11C 19/28* (2006.01)

(52) U.S. Cl.
CPC .............. *G11C 7/103* (2013.01); *G11C 19/28* (2013.01); *G11C 7/1006* (2013.01); *G11C 7/106* (2013.01)
USPC ..................................... 365/230.08; 365/194

(58) Field of Classification Search
USPC ............ 365/189.05, 194, 205, 230.08, 233.1
See application file for complete search history.

(56) References Cited

U.S. PATENT DOCUMENTS

| 5,128,673 | A | * | 7/1992 | Tamamura et al. | ........... 341/100 |
| 6,043,697 | A | * | 3/2000 | Jang | .............................. 327/299 |
| 6,580,659 | B1 | * | 6/2003 | Roohparvar | ................... 365/236 |
| 2007/0070713 | A1 | * | 3/2007 | Lee | .......................... 365/189.05 |
| 2007/0133314 | A1 | * | 6/2007 | Chae | ......................... 365/189.05 |
| 2008/0157811 | A1 | * | 7/2008 | Lee et al. | ......................... 326/30 |

FOREIGN PATENT DOCUMENTS

| JP | 11340817 A | * 12/1999 | ............. H03K 21/08 |
| KR | 10-2002-0004860 A | 1/2002 | |
| KR | 10-2005-0011439 A | 1/2005 | |
| KR | 10-0607161 B1 | 8/2006 | |

* cited by examiner

*Primary Examiner* — Vanthu Nguyen
*Assistant Examiner* — Khamdan Alrobaie
(74) *Attorney, Agent, or Firm* — William Park & Associates Ltd.

(57) ABSTRACT

A data output circuit includes an output control signal generation unit configured to generate output control signals in response to an output enable bar signal and a delay locked clock signal and a register configured to output stored data in response to the output control signals.

5 Claims, 8 Drawing Sheets

DATA OUTPUT CONTROL CIRCUIT OF SEMICONDUCTOR APPARATUS

CROSS-REFERENCES TO RELATED APPLICATION

The present application claims priority under 35 U.S.C. §119(a) to Korean application number 10-2010-0113766, filed on Nov. 16, 2010, in the Korean Intellectual Property Office, which is incorporated herein by reference in its entirety as set forth in full.

BACKGROUND

1. Technical Field

The present invention relates generally to a semiconductor circuit, and more particularly, to a data output circuit.

2. Related Art

A semiconductor device, for example, a semiconductor is memory device outputs data in response to a data output command, that is, a read command.

A data output circuit may be used for storing information corresponding to a burst operation and for outputting data at a certain timing from the read command is inputted.

The burst operation is an operation of consecutively outputting a certain number of data in response to one read command. The number of consecutively outputted data is determined by a burst length.

SUMMARY

A data output circuit capable of preventing occurrence of data output errors is described herein.

In an embodiment of the present invention, a data output circuit includes an output control signal generation unit configured to generate output control signals in response to a sub output enable signal and a delay fixing clock signal and a register configured to output stored data in response to the output control signal.

In an embodiment of the present invention, a data output circuit includes an output control signal generation unit configured to latch signals counted in response to a sub output enable signal in response to a signal obtained by combining the sub output enable signal and a delay fixing clock signal with each other and to generate the latched signals as output control signals and a register configured to output stored data in response to the output control signals.

In still an embodiment of the present invention, a data output circuit includes a preliminary output control signal generating section configured to sequentially count preliminary output control signals in response to a sub output enable signal, a latch section configured to latch the preliminary output control signals in response to a latch control signal obtained by combining the sub output enable signal and a delay fixing clock signal with each other and to output the latched signals as output control signals, and a register configured to output stored data in response to the output control signals.

According to the embodiments of the present invention, since an operation of latching a signal transited at an earlier point of time than in a conventional art is performed to generate an output control signal, signal loading and delay are reduced so that data can be stably output in a high speed operation.

BRIEF DESCRIPTION OF THE DRAWINGS

Features, aspects, and embodiments are described in conjunction with the attached drawings, in which.

DETAILED DESCRIPTION

Hereinafter, a data output circuit according to the present invention will be described below with reference to the accompanying drawings through exemplary embodiments.

Figure 1:
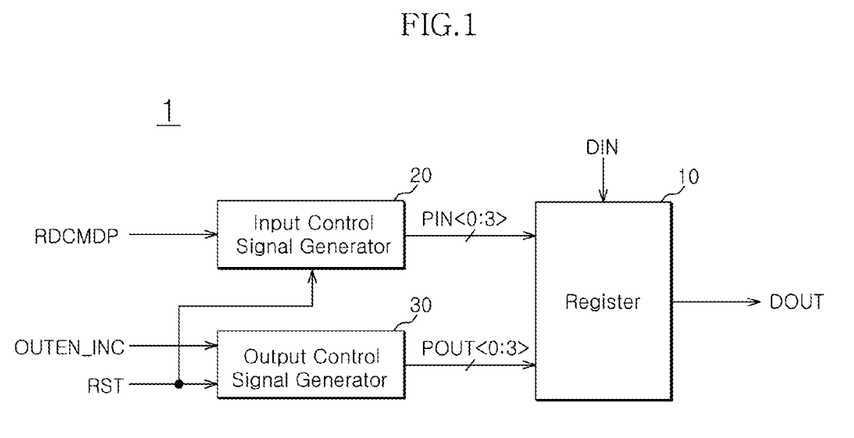
FIG. 1 is a block diagram of a data output circuit according to an embodiment of the present invention.

As illustrated in FIG. 1, a data output circuit 1 according to an embodiment of the present invention includes a register 10, an input control signal generation unit 20, and an output control signal generation unit 30.

The data output circuit 1 is configured to conform to a burst operation (BL=4).

The register 10 stores data inputted through an input terminal DIN in response to input control signals PIN<0:3> and is outputs the stored data through an output terminal DOUT in response to output control signals POUT<0:3>.

The input control signal generation unit 20 is configured to generate the input control signals PIN<0:3> in response to a read pulse signal RDCMDP.

The input control signal generation unit 20 is configured to initialize the input control signals PIN<0:3> in response to a reset signal RST.

The output control signal generation unit 30 is configured to generate the output control signals POUT<0:3> in response to an output enable signal OUTEN_INC.

The output control signal generation unit 30 is configured to initialize the output control signals POUT<0:3> in response to the reset signal RST.

Figure 2:
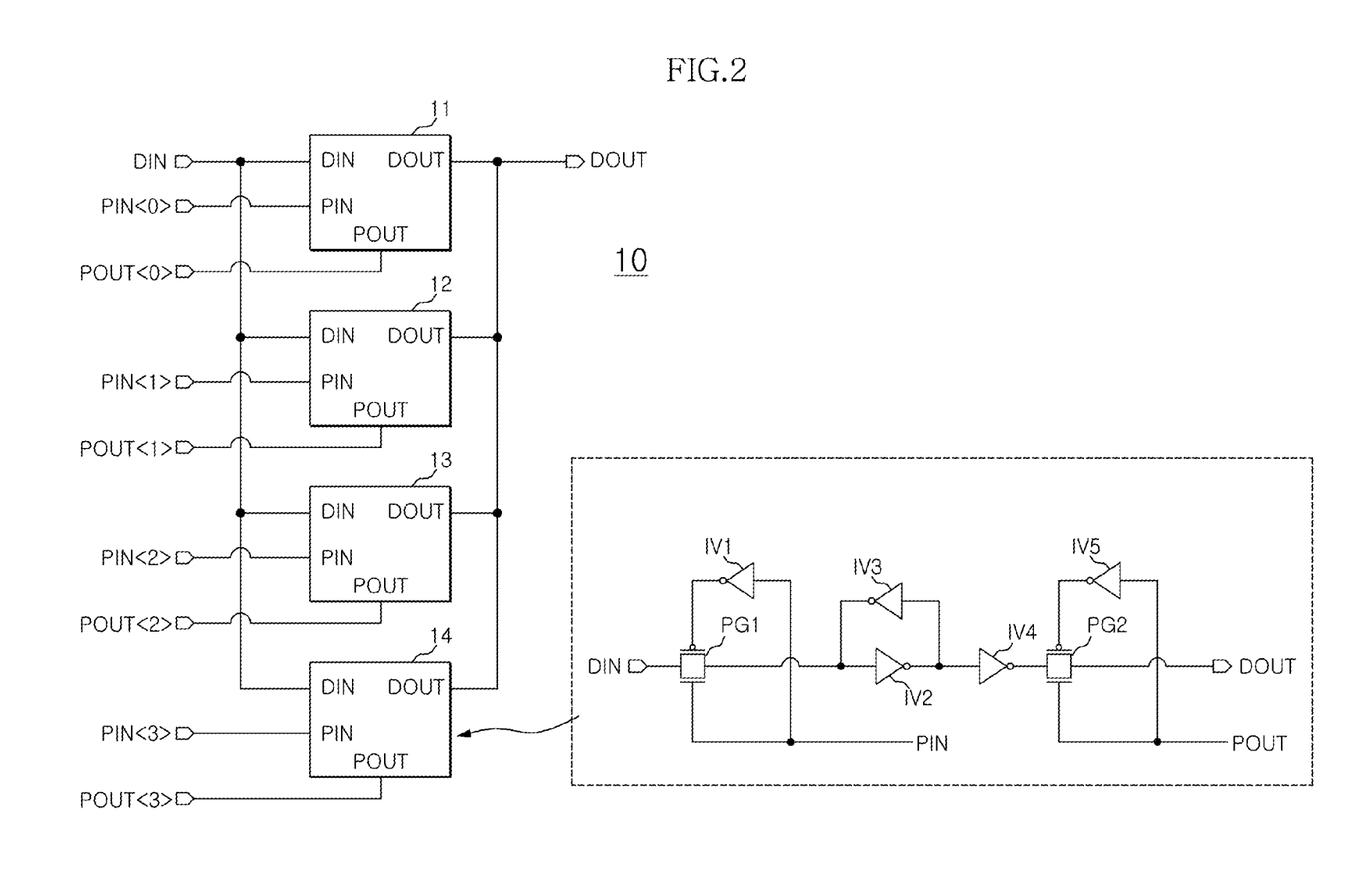
FIG. 2 is a block diagram illustrating the internal configuration of the register shown in FIG. 1.

As illustrated in FIG. 2, the register 10 includes a plurality of flip-flops 11, 12, 13 and 14.

The plurality of flip-flops 11, 12, 13 and 14 may be configured in the same way, and one flip-flop 14 among the plurality of flip-flops 11, 12, 13 and 14 includes a plurality of inverters IV1, IV2, IV3, IV4 and IV5 and a plurality of pass gates PG1 and PG2.

The flip-flops 11, 12, 13, and 14 receive data in response to the activation of the input control signals PIN<0:3> to store the received data in a latch and output the stored data in response to the activation of the output control signals POUT<0:3>.

Figure 3:
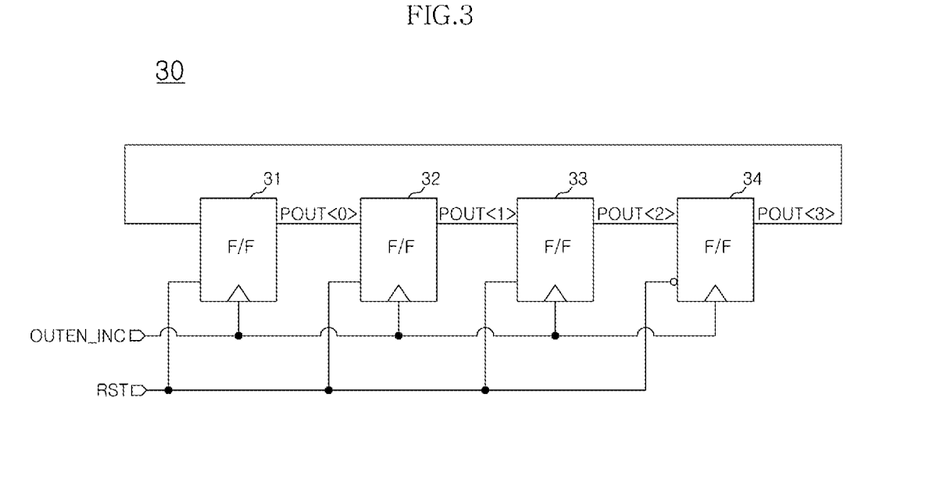
FIG. 3 is a block diagram illustrating the internal configuration of the output control signal generation unit shown in FIG. 1.

As illustrated in FIG. 3, the output control signal generation unit 30 may be configured by ring counters using a plurality of flip-flops 31, 32, 33 and 34.

The input control signal generation unit 20 may be configured to be the same as the output control signal generation unit 30.

The output control signal generation unit 30 initializes the output control signals POUT<0:2> to a logic low level of '0' and initializes the output control signal POUT<3> to a logic high level of '1' in response to the reset signal RST.

Figure 4:
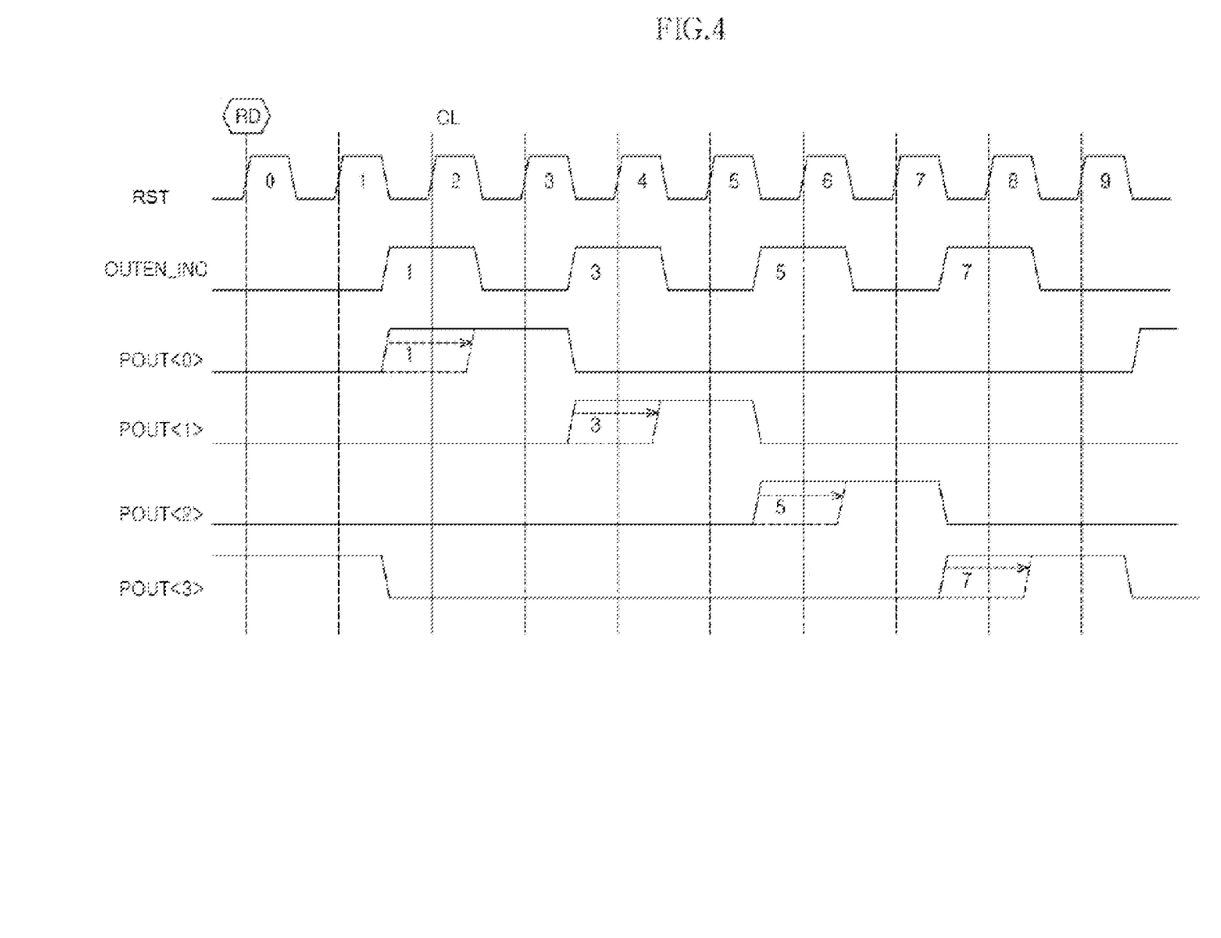
FIG. 4 is a timing diagram of output control signals according to an embodiment of the present invention.

As illustrated in FIG. 4, the output control signal generation unit 30 counts the output control signals POUT<0:3> in response to the output enable signal OUTEN_INC.

Here, since the output control signals POUT<0:3> is counted in response to the output enable signal OUTEN_INC, the count of the output control signals POUT<0:3> is implemented with a cycle of CL−0.5tCK.

However, according to the data output circuit 1, data output errors may be caused due to lack of a timing margin. In particular, during a high speed operation, a probability of the data output errors may increase.

That is to say, as the output enable signal OUTEN_INC is input to each of the plurality of flip-flops 31, 32, 33 and 34 of the output control signal generation unit 30, a loading increases and a signal delay in each flip-flop increases. Therefore, a delay time between the output enable signal OUTEN_INC and the output control signals POUT<0:3> may be longer than 0.5tCK.

Figure 5:
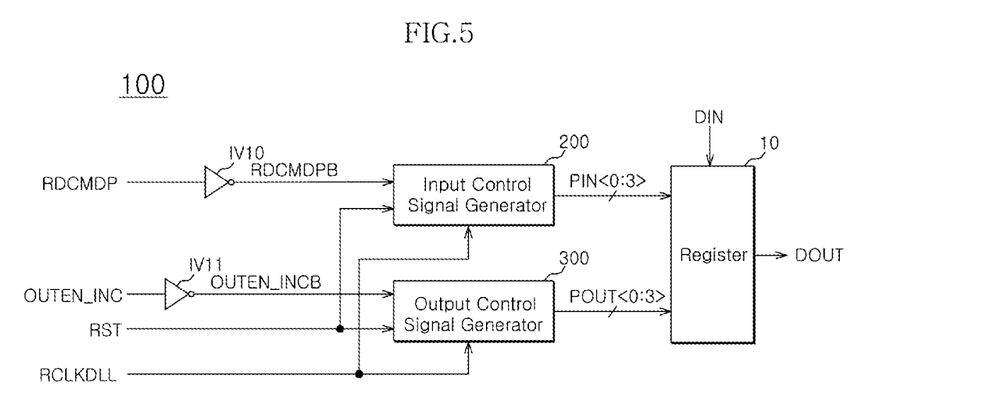
FIG. 5 is a block diagram of a data output circuit according to an embodiment of the present invention.

As illustrated in FIG. 5, a data output circuit 100 according to an embodiment of the present invention includes a register 10, an input control signal generation unit 200, and an output control signal generation unit 300. In addition, the data output circuit 100 may further include inverters IV10 and IV11 for inverting an output enable signal OUTEN_INC and a read pulse signal RDCMDP to generate an output enable bar signal OUTEN_INCB and a read pulse bar signal RDCMDPB.

Here, the output enable signal OUTEN_INC is a signal which is generated after the lapse of a CAS latency CL from a time when a read command RD is input, to conform to a burst operation, and the read pulse signal RDCMDP is a pulse signal which is generated according to the read command RD.

The data output circuit 100 according to an embodiment of the present invention is configured to conform to a burst operation (BL=4).

The burst operation is an operation of consecutively outputting a plurality of data. Here, the number of consecutively outputted data is determined by a burst length BL, and the output of the data begins after the lapse of the CAS latency CL.

The register 10 stores data inputted through an input terminal DIN in response to input control signals PIN<0:3> and outputs the stored data through an output terminal DOUT in response to output control signals POUT<0:3>.

The register 10 may be configured in the same manner as illustrated in FIG. 2.

The input control signal generation unit 200 is configured to generate the input control signals PIN<0:3> in response to the read pulse bar signal RDCMDPB, a delay locked clock signal RCLKDLL and a reset signal RST.

The output control signal generation unit 300 is configured to generate the output control signals POUT<0:3> in response to the output enable bar signal OUTEN_INCB, the delay locked clock signal RCLKDLL and the reset signal RST.

Figure 6:
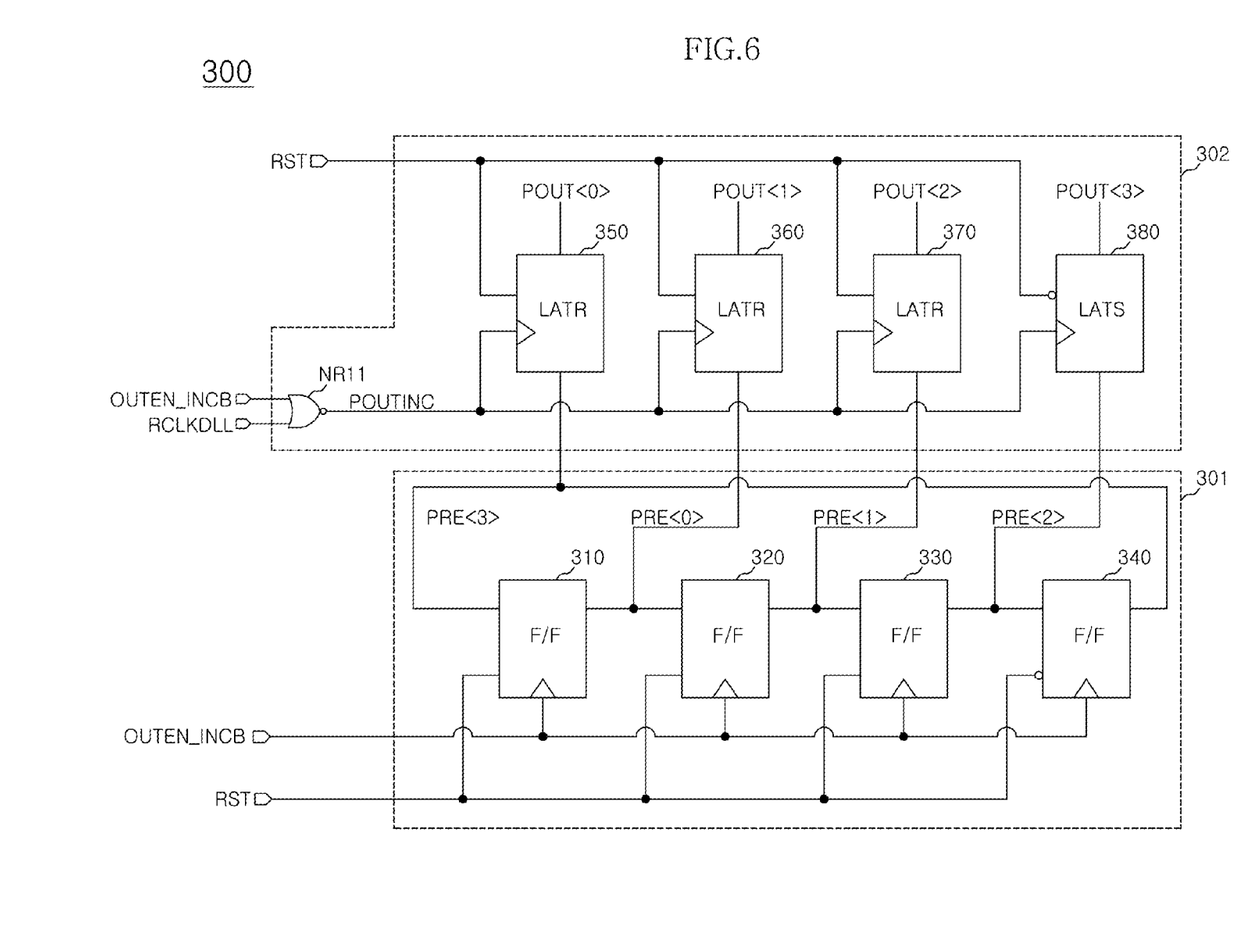
FIG. 6 is a block diagram illustrating the internal configuration of the output control signal generation unit shown in FIG. 5.

Referring to FIG. 6, the output control signal generation unit 300 includes a preliminary output control signal generating section 301 and a latch section 302.

The preliminary output control signal generating section 301 is configured to generate preliminary output control signals PRE<0:3> in response to the output enable bar signal OUTEN_INCB and the reset signal RST.

The preliminary output control signal generating section 301 may comprise a ring counter including a plurality of flip-flops (F/F) 310 to 340.

The flip-flops 310 to 330 initialize the preliminary output control signals PRE<0:2> to a logic low level of '0' in response to activation of the reset signal RST. The flip-flop 340 initializes the preliminary output control signal PRE<3> to a logic high level of '1' in response to activation of the reset signal RST.

The plurality of flip-flops (F/F) 310, 320, 330 and 340 sequentially count the preliminary output control signals PRE<0:3> in response to the output enable bar signal OUTEN_INCB.

The latch unit 302 is configured to latch the preliminary output control signals PRE<0:3> in response to the output enable bar signal OUTEN_INCB and the delay locked clock signal RCLKDLL, and generate the output control signals POUT<0:3>.

The latch unit 302 includes a NOR gate NR11 and a plurality of latches (LATR and LATS) 350, 360, 370 and 380.

The NOR gate NR11 is configured to perform NOR operation on the output enable bar signal OUTEN_INCB and the delay locked clock signal RCLKDLL, and generate a latch control signal POUTINC.

The plurality of latches 350, 360, 370 and 380 receive the preliminary output control signals PRE<0:3> in the sequence of PRE<3>, PRE<0>, PRE<1> and PRE<2>.

The latch 350 outputs the preliminary output control signal PRE<3> as the output control signal POUT<0>. The latch 360 outputs the preliminary output control signal PRE<0> as the output control signal POUT<1>. The latch 370 outputs the preliminary output control signal PRE<1> as the output control signal POUT<2>. The latch 380 outputs the preliminary output control signal PRE<2> as the output control signal POUT<3>.

Figure 7A:
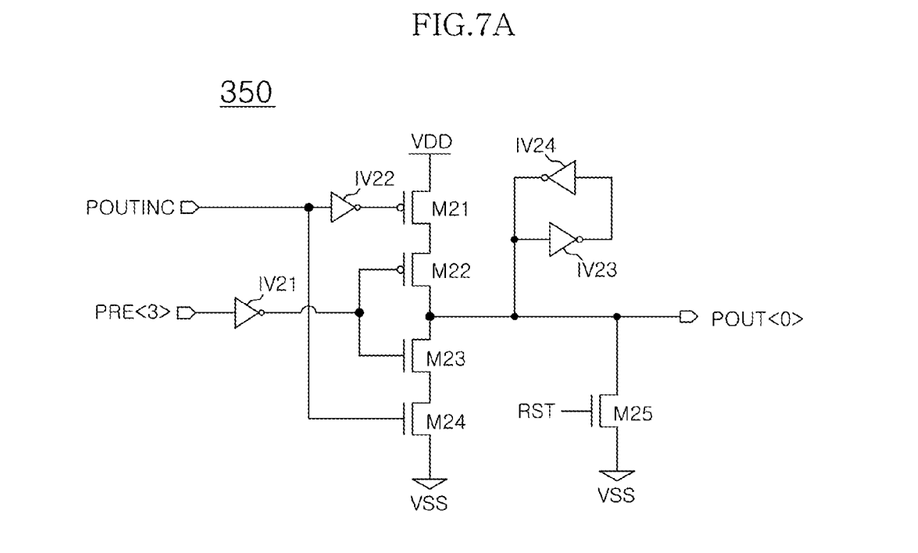
FIGS. 7a and 7b are circuit diagrams illustrating the latches shown in FIG. 6.

Referring to FIG. 7a, the latch (LATR) 350 may comprise a plurality of inverters IV21, IV22, IV23 and IV24 and a plurality of transistors M21, M22, M23, M24 and M25.

Figure 7B:
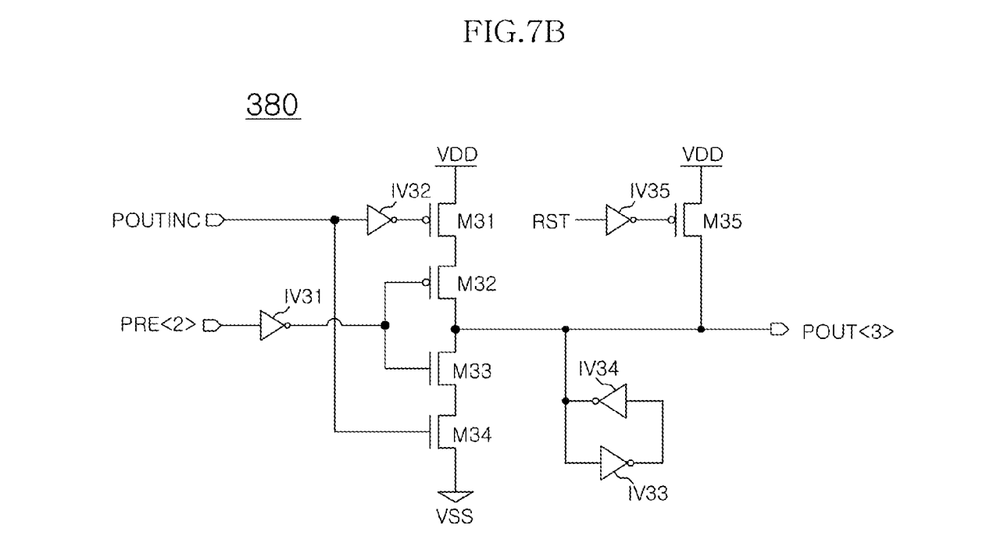

Referring to FIG. 7b, the latch (LATS) 380 may be configured by a plurality of inverters IV31, IV32, IV33, IV34 and IV35 and a plurality of transistors M31, M32, M33, M34 and M35.

The latches (LATR) 350, 360 and 370 initialize the output control signals POUT<0:2> to a logic low level in response to the reset signal RST. The latch (LATS) 380 initializes the output control signal POUT<3> to a logic high level in response to the reset signal RST.

The plurality of latches 350, 360, 370 and 380 latch the preliminary output control signals PRE<3, 0, 1, 2> in response to the latch control signal POUTINC of a logic high level and output the latched signals as the output control signals POUT<0:3>.

The input control signal generation unit 200 may be configured in the same manner as the output control signal generation unit 300.

Operations of the data output circuit 100 according to an embodiment of the present invention, configured as described above, will be illustrated below.

Figure 8:
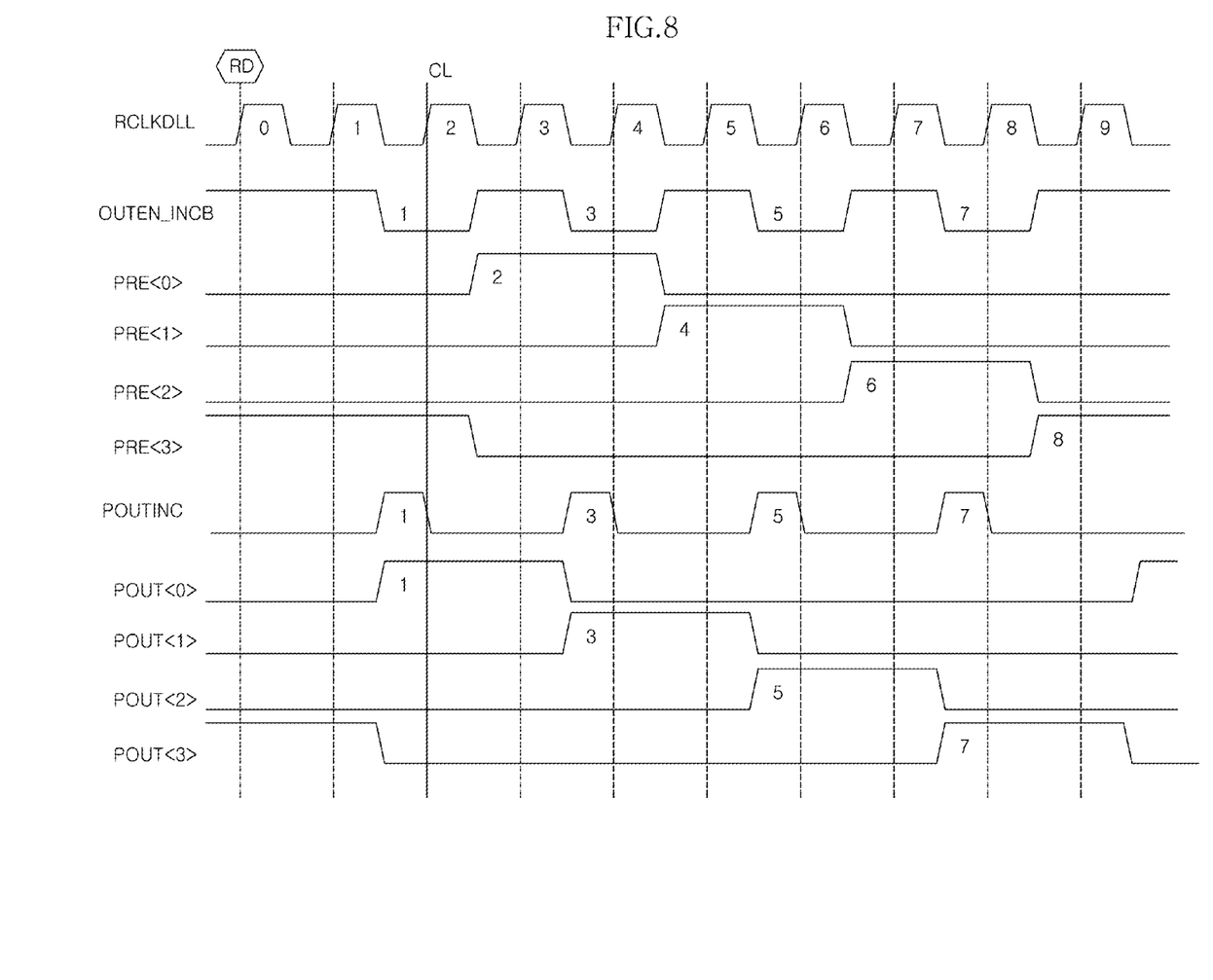
FIG. 8 is a timing diagram showing output control signals according to an embodiment of the present invention.

Referring to FIG. 6 and FIG. 8, the preliminary output control signals PRE<0:3> are respectively initialized to a logic low level, a logic low level, a logic low level and a logic high level in response to the reset signal RST of a logic high level.

In an embodiment of the present invention, the output enable bar signal OUTEN_INCB is used.

If the output enable signal OUTEN_INC is used, the output control signals POUT<0:3> are counted with a cycle of CL−0.5tCK of a current burst operation.

However, in an embodiment of the present invention, since the output enable bar signal OUTEN_INCB is used, the preliminary output control signals PRE<0:3> are counted with a cycle of CL+0.5tCK of a previous burst operation. That is, the preliminary output control signals PRE<0:3> are counted at an earlier timing than the case where the output enable signal OUTEN_INC is used.

The preliminary output control signal PRE<3> is already initialized to a logic high level at a time when both the output enable bar signal OUTEN_INCB and the delay fixing clock signal RCLKDLL transition to a logic low level.

Therefore, the latch 350 latches the preliminary output control signal PRE<3> in response to the latch control signal POUTINC transitioned to a logic high level, and outputs the latched signal as the output control signal POUT<0>.

That is to say, since the output control signal POUT<0> is generated by simply latching the preliminary output control signal PRE<3> already transitioned to a logic high level at an earlier time, loading and delay may decrease.

In the case of the output control signals POUT<1:3>, the preliminary output control signals PRE<0:2> are already transitioned to a logic high level at a time corresponding to CL+0.5tCK of a previous burst operation.

Accordingly, the latches 360 to 380 latch the preliminary is output control signals PRE<0:2> in response to the latch control signal POUTINC transitioned to a logic high level and output the latched signals as the output control signals POUT<1:3>.

As is apparent from the above descriptions, in an embodiment of the present invention, since the output control signals POUT<0:3> are generated by performing the operation of latching the preliminary output control signals PRE<0:3> transitioned at an earlier time, signal loading and delay may decrease. Thus, data output errors may decrease, and data may be stably outputted even in a high speed operation.

While certain embodiments have been described above, it will be understood to those skilled in the art that the embodiments described are by way of example only. Accordingly, the data output circuit described herein should not be limited based on the described embodiments. Rather, the data output circuit described herein should only be limited in light of the claims that follow when taken in conjunction with the above description and accompanying drawings.

What is claimed is:

1. A data output circuit comprising:
   a preliminary output control signal generating section configured to sequentially count preliminary output control signals in response to a output enable bar signal;
   a latch section configured to latch the preliminary output control signals in response to a latch control signal acquired by combining the output enable bar signal and a delay locked clock signal with each other and to output the latched signals as output control signals; and
   a register configured to output stored data in response to the output control signals.

2. The data output circuit according to claim 1, wherein the preliminary output control signal generating section is configured to initialize the most significant bit of the preliminary output control signals to an activated level in response to a reset signal.

3. The data output circuit according to claim 1, wherein the latch unit is configured to latch the most significant bit of the preliminary output control signals in response to the latch control signal, and output the latched signal as the least significant bit of the output control signals.

4. The data output circuit according to claim 1, wherein the latch unit is configured to latch the preliminary output control signals at a time when the output enable bar signal and the delay locked clock signal are deactivated.

5. The data output circuit according to claim 1, wherein the output enable bar signal is acquired by inverting a signal generated after the lapse of a CAS latency from a time when a read command is input, and wherein the signal is generated to conform to a burst operation.

* * * * *